US012642084B2

(12) United States Patent
Tapily et al.

(10) Patent No.: US 12,642,084 B2
(45) Date of Patent: May 26, 2026

(54) METHOD OF FORMING A SEMICONDUCTOR DEVICE WITH AIR GAPS FOR LOW CAPACITANCE INTERCONNECTS

(71) Applicant: Tokyo Electron Limited, Tokyo (JP)

(72) Inventors: Kandabara Tapily, Albany, NY (US);
Jeffrey Smith, Albany, NY (US);
Robert D Clark, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 612 days.

(21) Appl. No.: 18/179,518

(22) Filed: Mar. 7, 2023

(65) Prior Publication Data

US 2023/0290677 A1    Sep. 14, 2023

Related U.S. Application Data

(60) Provisional application No. 63/317,896, filed on Mar. 8, 2022.

(51) Int. Cl.
*H01L 21/768* (2006.01)
*H10W 20/00* (2026.01)
*H10W 20/46* (2026.01)

(52) U.S. Cl.
CPC ......... *H10W 20/46* (2026.01); *H10W 20/072* (2026.01); *H10W 20/077* (2026.01)

(58) Field of Classification Search
CPC ........... H01L 21/7682; H01L 21/76834; H01L 21/76832; H01L 23/5222; H01L 23/53295; H01L 21/76885
See application file for complete search history.

(56) References Cited

U.S. PATENT DOCUMENTS

| | | | |
|---|---|---|---|
| 6,610,593 | B2 | 8/2003 | Kohl |
| 9,281,277 | B2 | 3/2016 | Baek et al. |
| 9,553,019 | B1 | 1/2017 | Briggs |
| 10,361,117 | B2 | 7/2019 | Penny |
| 11,482,453 | B2 | 10/2022 | Lee et al. |
| 2011/0291281 | A1* | 12/2011 | Huang ................ H01L 21/7682 |
| | | | 438/618 |

(Continued)

FOREIGN PATENT DOCUMENTS

| | | |
|---|---|---|
| KR | 20150073595 A | 7/2015 |
| KR | 20200143605 A | 12/2020 |

OTHER PUBLICATIONS

Korean Intellectual Property Office, International Search Report and Written Opinion for International application No. PCT/US2023/063827, mailed Jun. 23, 2023, 9pp.

*Primary Examiner* — Karen Kusumakar

(57) ABSTRACT

A method of forming a semiconductor device with air gaps for low capacitance interconnects. The method includes providing a substrate containing raised metal features with a top area and a sidewall, and a void between the raised metal features, filling the void with a sacrificial fill material, and selectively depositing a blocking layer on the sacrificial fill material. The method further includes depositing a cap layer on the top area of the raised metal features, where the cap layer has an overhang that extends past the sidewall, removing the blocking layer and the sacrificial fill material between the raised metal features, and depositing a dielectric film, where the dielectric film forms an air gap between the raised metal features below the overhang.

9 Claims, 11 Drawing Sheets

(56) References Cited

U.S. PATENT DOCUMENTS

| | | | |
|---|---|---|---|
| 2015/0037980 A1 | 2/2015 | Rha et al. | |
| 2017/0210896 A1 | 7/2017 | Nakasugi et al. | |
| 2022/0013651 A1 | 1/2022 | Kang et al. | |
| 2023/0038952 A1* | 2/2023 | Lin | H01L 21/7682 |
| 2023/0068760 A1* | 3/2023 | Huang | H01L 21/7682 |

* cited by examiner

METHOD OF FORMING A SEMICONDUCTOR DEVICE WITH AIR GAPS FOR LOW CAPACITANCE INTERCONNECTS

CROSS-REFERENCE TO RELATED APPLICATIONS

This application is related to and claims priority to U.S. Provisional Patent Application Ser. No. 63/317,896 filed on Mar. 8, 2022, the entire contents of which are herein incorporated by reference.

FIELD OF INVENTION

The present invention relates to the field of semiconductor manufacturing and semiconductor devices, and more particularly, to a method of forming a semiconductor device with air gaps for low capacitance interconnects.

BACKGROUND OF THE INVENTION

As device feature size is scaled, interconnects are becoming a significant problem in performance improvement. This is in part due to an increase in electrical resistivity (Rs) with ever decreasing device feature sizes and detrimental capacitance between adjacent features. One way of reducing capacitance is using ultra low-k dielectric materials, but air gaps offer the lowest dielectric constant (k) value of approximately 1. As a result, device manufacturers are adding air gaps to critical layers in advanced metallization schemes.

SUMMARY OF THE INVENTION

This disclosure describes a novel method of fabricating air gaps in advanced semiconductor devices. According to one embodiment, the method includes providing a substrate containing raised metal features with a top area and a sidewall, and a void between the raised metal features, filling the void with a sacrificial fill material, and selectively depositing a blocking layer on the sacrificial fill material. The method further includes depositing a cap layer on the top area of the raised metal features, where the cap layer has an overhang that extends past the sidewall, removing the blocking layer and the sacrificial fill material between the raised metal features, and depositing a dielectric film, where the dielectric film forms an air gap between the raised metal features below the overhang.

According to another embodiment, the method includes providing a substrate containing raised metal features with a top area and a sidewall, and a void between the raised metal features, depositing a cap layer on the top area of the raised metal features, wherein the cap layer has an overhang that extends past the sidewall, and filling the void with a sacrificial fill material. The method further includes depositing a dielectric film on the sacrificial fill material and the cap layer, decomposing the sacrificial fill material into one or more gaseous decomposition products, and removing at least one of the one or more gaseous decomposition products by diffusion through the dielectric film, where the decomposition of the sacrificial fill material forms an air gap between the raised metal features below the overhang.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

A method of fabricating air gaps in advanced semiconductor devices is described. The method includes using mushrooming during selective film deposition to facilitate formation of air gaps in a dielectric material.

Figure 1A:
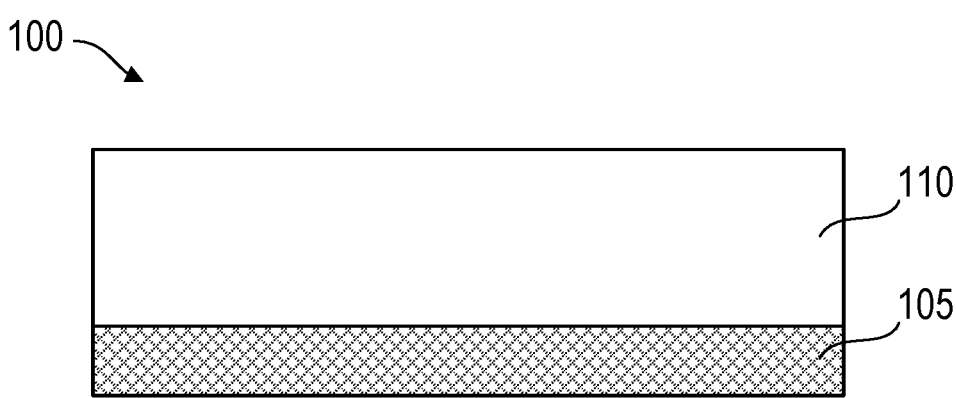
FIGS. 1A-1H schematically show through cross-sectional views a method of processing a substrate according to an embodiment of the invention.

FIGS. 1A-1H schematically show through cross-sectional views a method of processing a substrate according to an embodiment of the invention. The method includes, providing a substrate 100 containing a base film 105 and a metal layer 110 on the base film 105. This is schematically shown in FIG. 1A. Examples of the metal layer 110 include metals commonly found in semiconductor devices, for example ruthenium metal (Ru), molybdenum metal (Mo), tungsten metal (W), copper metal (Cu), cobalt metal (Co), a binary metal alloy, or a ternary metal alloy.

Figure 1B:
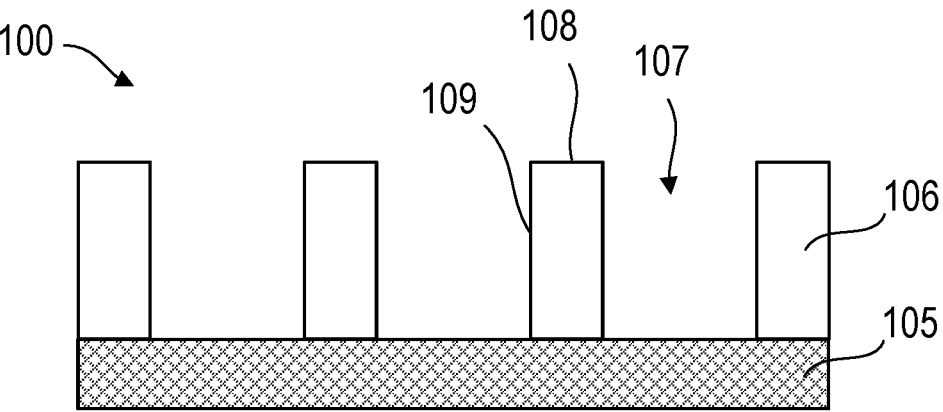
Figure 1C:
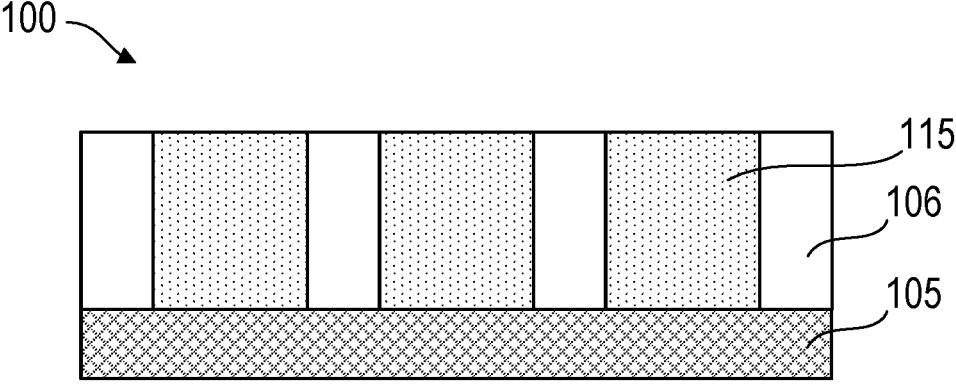

The method further includes patterning the metal layer 110 to form raised metal features 106 (metal lines) that are separated by voids 107. In one example, the patterning can include forming a patterned mask layer on the metal layer 110, and performing anisotropic gas phase etching of the metal layer 110 according to the patterned mask layer to form the raised metal features 106. The resulting structure is schematically shown in FIG. 1B. The raised metal features 106 contain a top area 108 and a sidewall 109, and a void 107 between raised metal features 106.

In another example, the structure in FIG. 1B may be formed using a semi-damascene process that includes patterning via openings in a mask layer and anisotropically etching vias into an underlying dielectric film. Thereafter, the vias are filled with a metal, and the dielectric film removed to form the patterned metal layer with raised metal features 106.

The method further includes filling the void 107 between the raised metal features 106 with a sacrificial fill material 115. For example, the sacrificial fill material 115 can contain a dielectric material. Examples include silicon-containing dielectric materials such as $SiO_2$ and SiOC. The resulting structure may be planarized using a planarizing process (e.g., chemical mechanical polishing) to form the planarized structure schematically shown in FIG. 1C, where exposed surfaces of the top area 108 of the raised metal features 106 and exposed surfaces of sacrificial fill material 115 are at least substantially in the same horizontal plane.

Figure 1D:
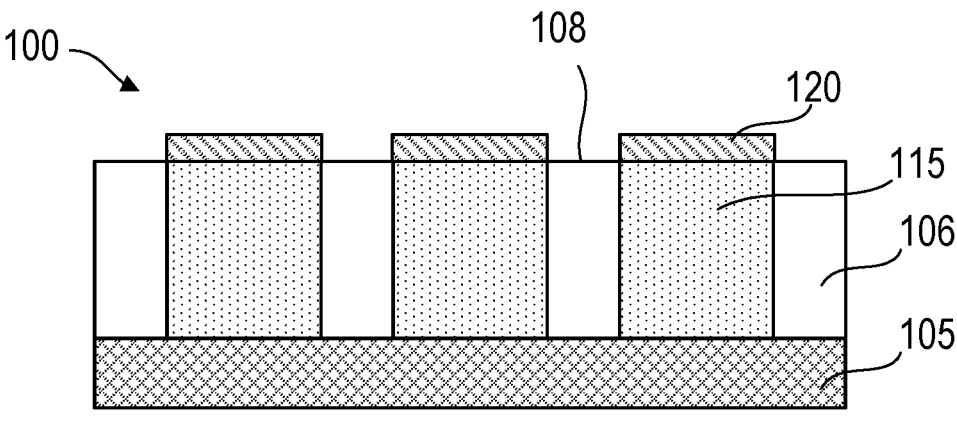
Figure 1E:
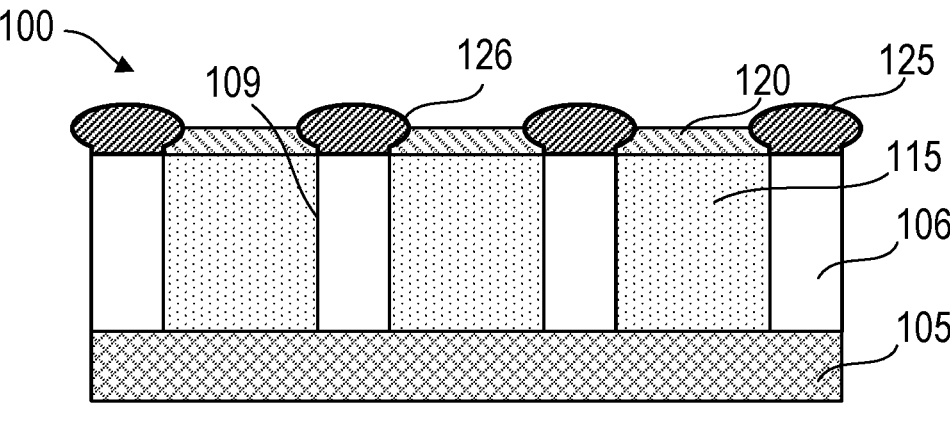

The method further includes selectively depositing a blocking layer 120 on the exposed surfaces of the sacrificial fill material 115. This is schematically shown in FIG. 1D. In one example, the blocking layer 120 can include, but is not limited to, a self-assembled monolayer (SAM) that selectively forms on the sacrificial fill material 115 relative to the top area 108 of the raised metal features 106. In one example, the blocking layer 120 can contain a bi-layer SAM containing vertically stacked layers of different SAM molecules. In another example, the blocking layer can contain a carbon-based material.

The method further includes selectively depositing a cap layer 125 on the top area 108 of the raised metal features 106, where the cap layer 125 has an overhang 126 that extends horizontally past the sidewall 109. The blocking layer 120 on the sacrificial fill material 115 facilitates high deposition selectivity of the cap layer 125 on the top area 108 of the raised metal features 106. The deposition of the cap layer 125 can be performed until a degree of mushrooming (i.e., lateral growth) above the blocking layer 120 is reached. In the embodiment shown in FIG. 1E, the overhang 126 covers a portion of the blocking layer 120. The cap layer 125 can contain a dielectric material. The dielectric material can, for example, contain a metal oxide or a silicon-containing dielectric material. Examples include $Al_2O_3$, $HfO_2$, and other metal oxides, $SiCN_x$, $TiO_2$, $AlON_x$, $AlN_x$, $SiO_2$, SiOC, SiOCN, and organic layers such as carbon-based layers. According to one embodiment, the cap layer 125 may include the same material as the sacrificial fill material 115. The degree of mushrooming may be tuned by controlling the thickness and the lateral growth of the cap layer 125.

Figure 1F:
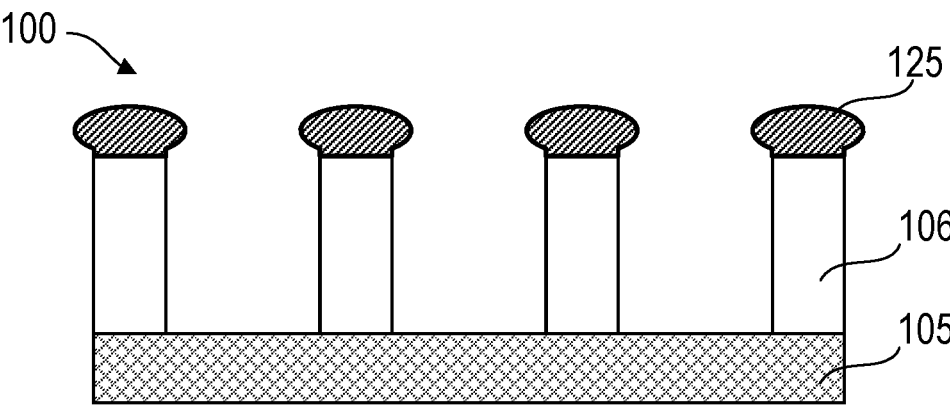

The method further includes removing the blocking layer 120 and the sacrificial fill material 115 between the raised metal features 106. The resulting structure is schematically shown in FIG. 1F. In one example, the removing can include one or more a gaseous isotropic etching processes, or a heat-treatment.

Figure 1G:
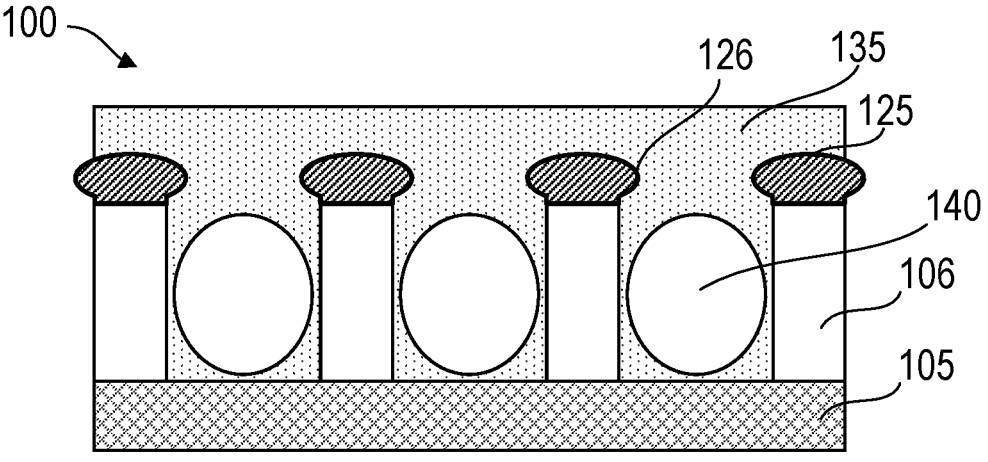

The method further includes depositing a dielectric film 135 over the structure in FIG. 1F, where the dielectric film 135 forms an air gap 140 between the raised metal features 106 below the overhang 126 of the cap layer 125. This is schematically shown in FIG. 1G. The presence of the overhang 126 of the cap layer 125 narrows the opening at the top of the void 107 between the raised metal features 106 and this aids in the formation of the air gap 140 where no dielectric material is formed during the deposition of the dielectric film 135. In one example, the dielectric film 135 may be deposited in two or more steps, for example using a conformal deposition step followed by a non-conformal deposition step, or using a non-conformal deposition step followed by a conformal deposition step. According to one embodiment, the dielectric film 135 may include a different material than the cap layer 125. According to another embodiment, the dielectric film 135 may include the same material as the cap layer 125.

Figure 1H:
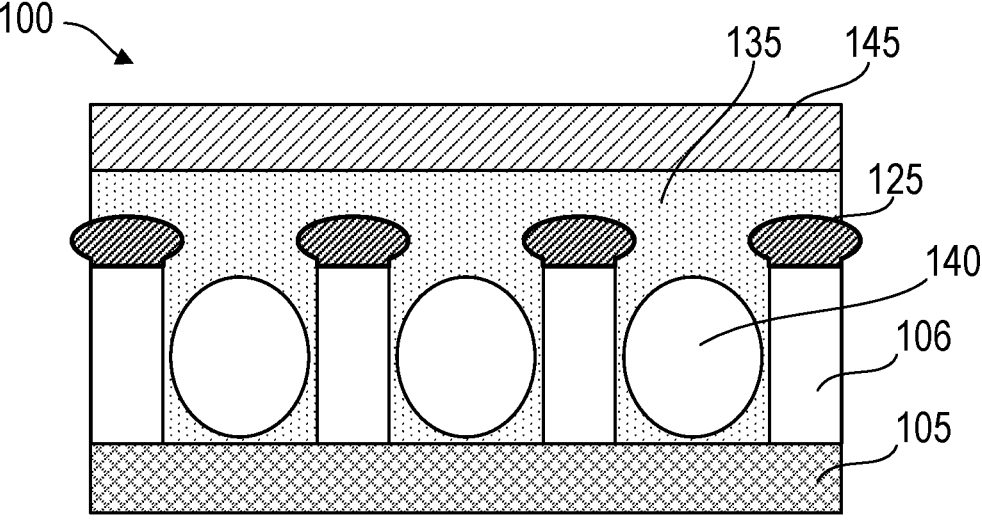

According to one embodiment, following deposition of the dielectric film 135, the substrate 100 may be further processed to form a device. In one example, the method can further include depositing a blanket dielectric film 145 over the film structure in FIG. 1G. This is schematically shown in FIG. 1H. The blanket dielectric film 145 can, for example, include a silicon-containing dielectric material such as $SiO_2$, SiOC, or SiOCN. The blanket dielectric film 145 may, for example, be used as an etch stop layer during subsequent metallization processing.

Figure 2A:
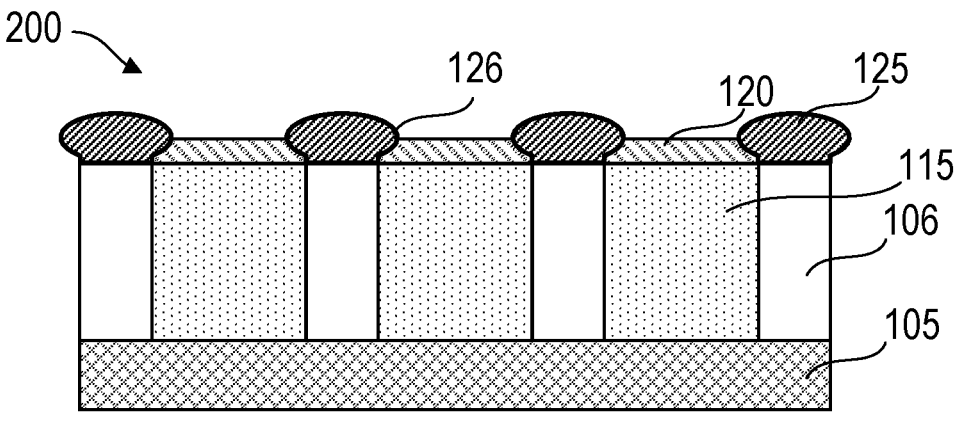
FIGS. 2A-2E schematically show through cross-sectional views a method of processing a substrate according to an embodiment of the invention.
Figure 2B:
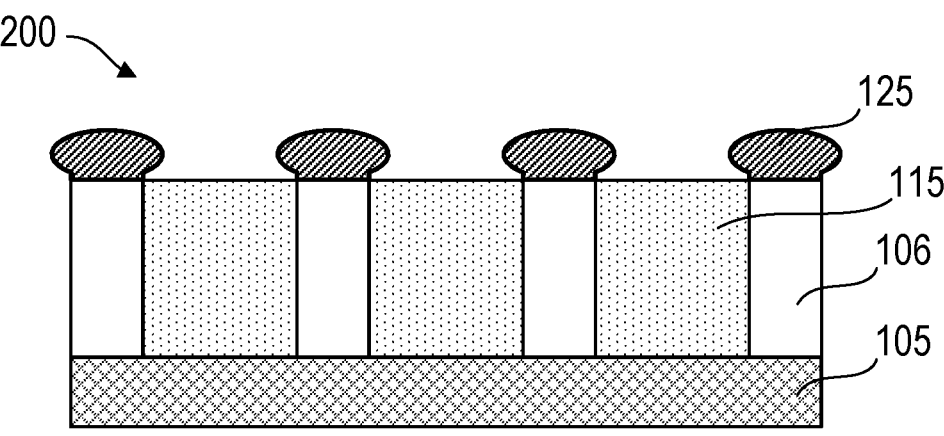

FIGS. 2A-2E schematically show through cross-sectional views a method of processing a substrate according to an embodiment of the invention. The substrate 100 in FIG. 1E has been reproduced as substrate 200 in FIG. 2A. The method further includes selectively removing the blocking layer 120 from the sacrificial fill material 115. The resulting structure is schematically shown in FIG. 2B. In one example, a SAM blocking layer may be removed by heat-treating.

Figure 2C:
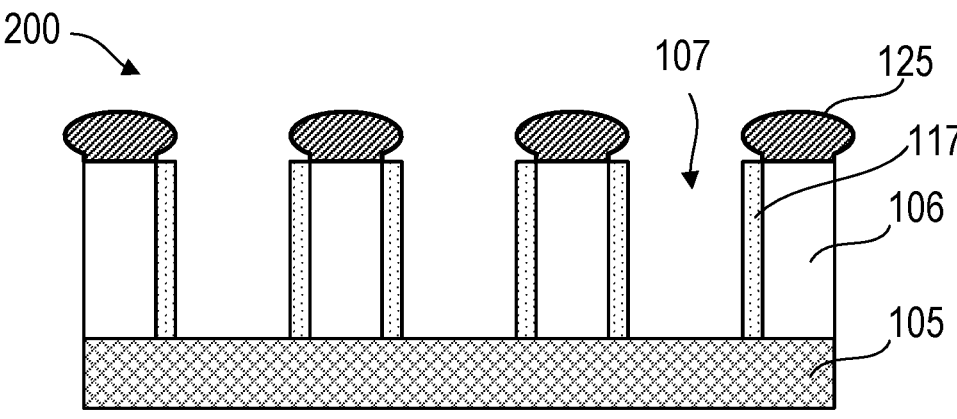

The method further includes performing an anisotropic etching process that removes a portion of the sacrificial fill material 115 from the void 107 but leaves a spacer layer 117 (sidewall spacer) on the sidewall 109 of the raised metal features 106. The presence of the overhang 126 aids in the formation of the spacer layer 117. The resulting structure is schematically shown in FIG. 2C.

Figure 2D:
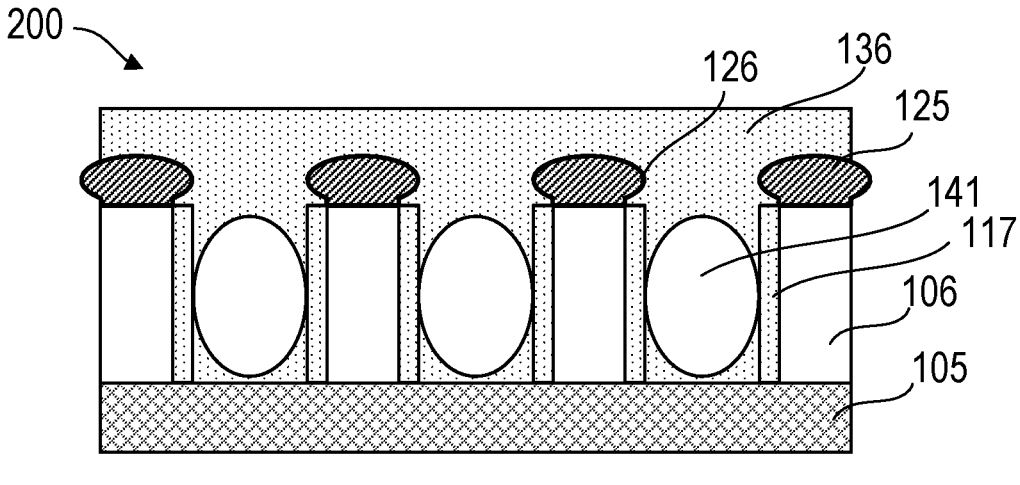

The method further includes depositing a dielectric film 136 over the structure in FIG. 2C, where the dielectric film 136 forms an air gap 141 between the raised metal features 106 below the overhang 126. The resulting structure is schematically shown in FIG. 2D. The presence of the overhang 126 narrows the opening at the top of the void 107 between the raised metal features 106 and this aids in the formation of the air gap 141 during the deposition of the dielectric film 136. In one example, the dielectric film 136 may be deposited in two or more steps, for example using a conformal deposition step followed by a non-conformal deposition step, or using a non-conformal deposition step followed by a conformal deposition step. According to one embodiment, the dielectric film 136 may include a different material than the cap layer 125. According to another embodiment, the dielectric film 136 may include the same material as the cap layer 125.

Figure 2E:
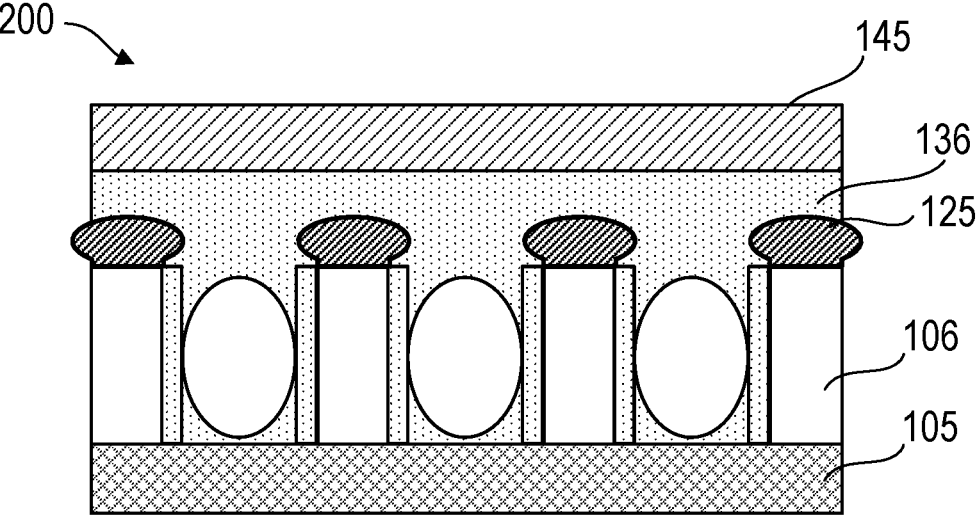

According to one embodiment, the method can further include depositing a blanket dielectric film 145 over the film structure in FIG. 2D. This is schematically shown in FIG. 2E. The blanket dielectric film 145 can, for example, include a silicon-containing dielectric material such as $SiO_2$, SiOC, or SiOCN. The blanket dielectric film 145 may, for example, be used as an etch stop layer during subsequent metallization processing.

Figure 3A:
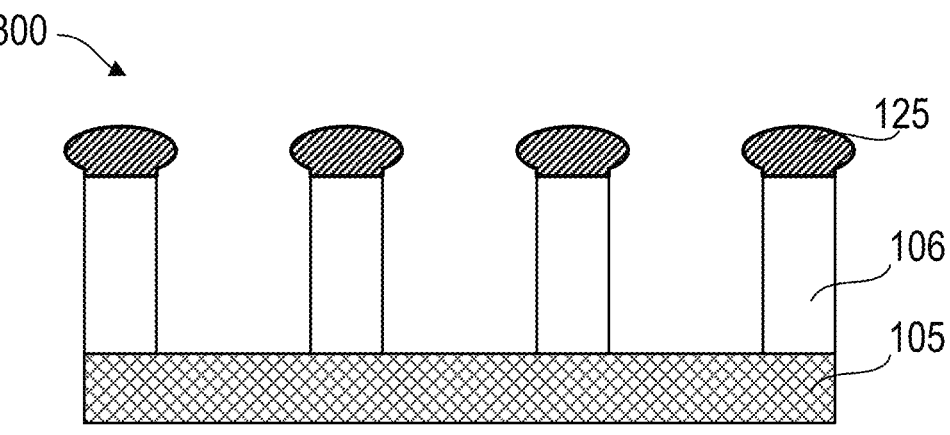
FIGS. 3A-3E schematically show through cross-sectional views a method of processing a substrate according to an embodiment of the invention.
Figure 3B:
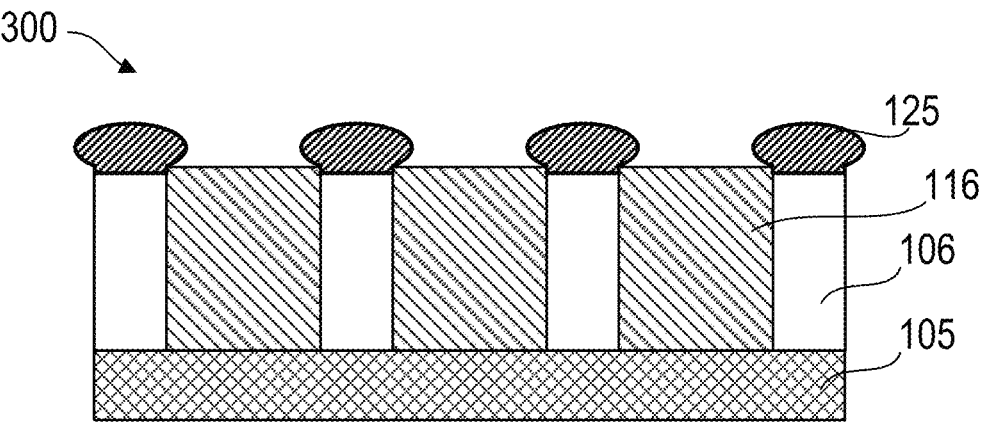
Figure 3C:
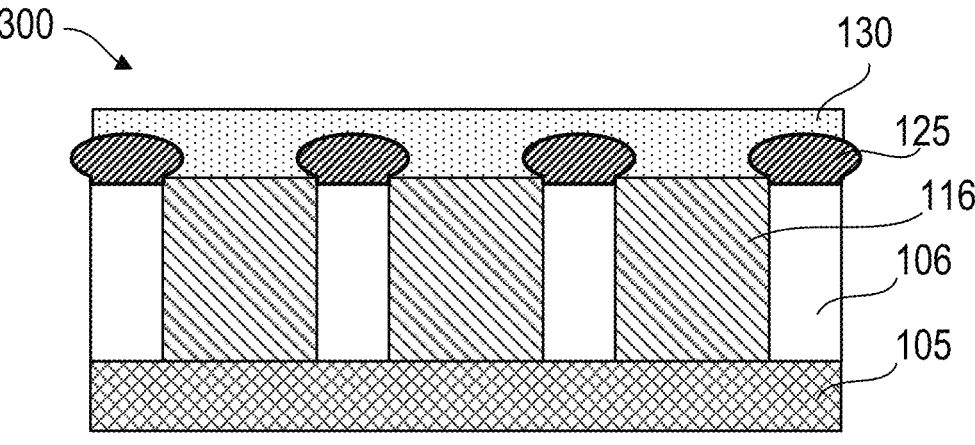

FIGS. 3A-3E schematically show through cross-sectional views a method of processing a substrate according to an embodiment of the invention. The substrate 100 in FIG. 1F has been reproduced as substrate 300 in FIG. 3A. The method further includes filling the void 107 between raised metal features 106 with a sacrificial fill material 116. According to one embodiment, the sacrificial fill material 116 can include amorphous carbon (a-C) that may be deposited by a PECVD process. The resulting structure is schematically shown in FIG. 3B. The method further includes depositing a blanket dielectric film 130 on the sacrificial fill material 116 and the cap layer 125. The blanket dielectric film 130 can, for example, include a silicon-containing dielectric material such as $SiO_2$, SiOC, or SiOCN. The resulting structure is schematically shown in FIG. 3C.

Figure 3D:
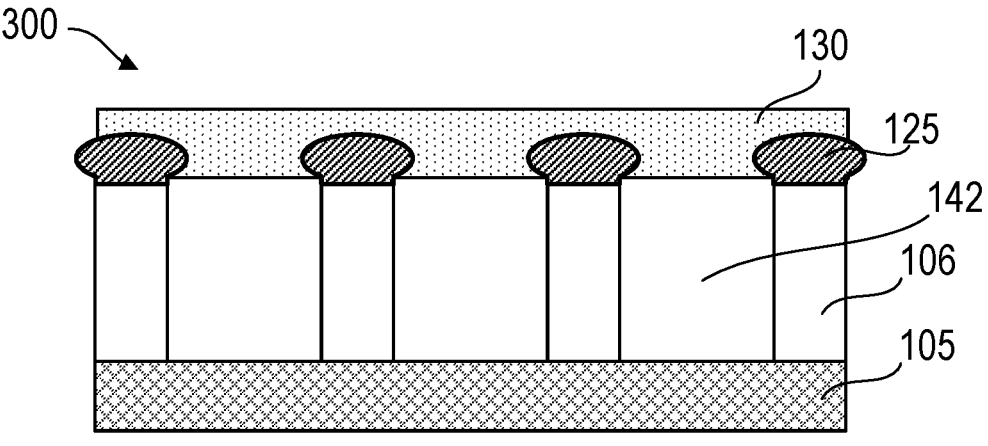
Figure 3E:
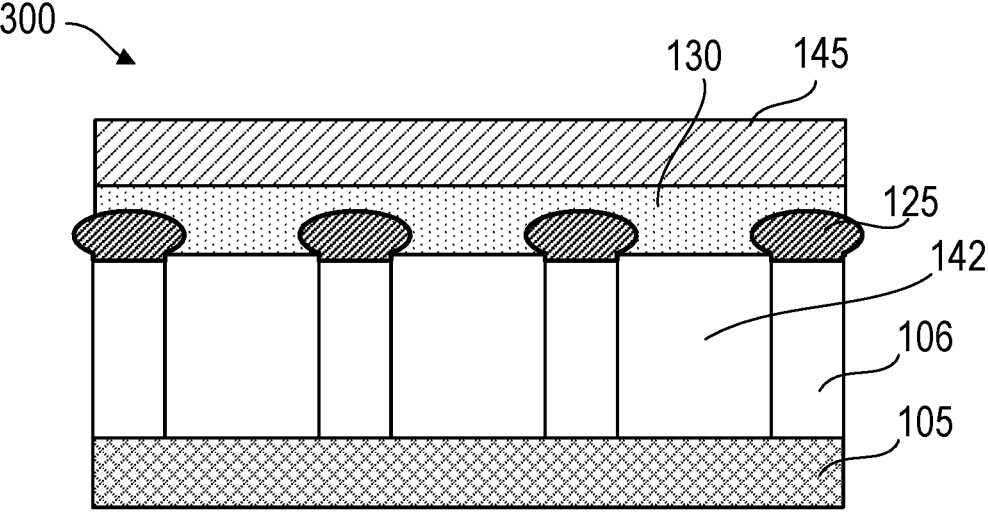

The method further includes heat-treating the film structure in FIG. 3C to remove the sacrificial fill material 116. The resulting film structure is schematically shown in FIG. 3D. The heat-treating may be performed in an oxidizing atmosphere such as $O_2$ and results in decomposition of the sacrificial fill material 116 into one or more gaseous decomposition products, and removal of the at least one of the one or more gaseous decomposition products by diffusion through the blanket dielectric film 130, where the decomposition and removal of the sacrificial fill material 116 forms an air gap 142 between the raised metal features 106. According to one embodiment, the method can further include depositing a blanket dielectric film 145 over the film structure in FIG. 3D. The resulting structure is schematically shown in FIG. 3E.

Figure 4A:
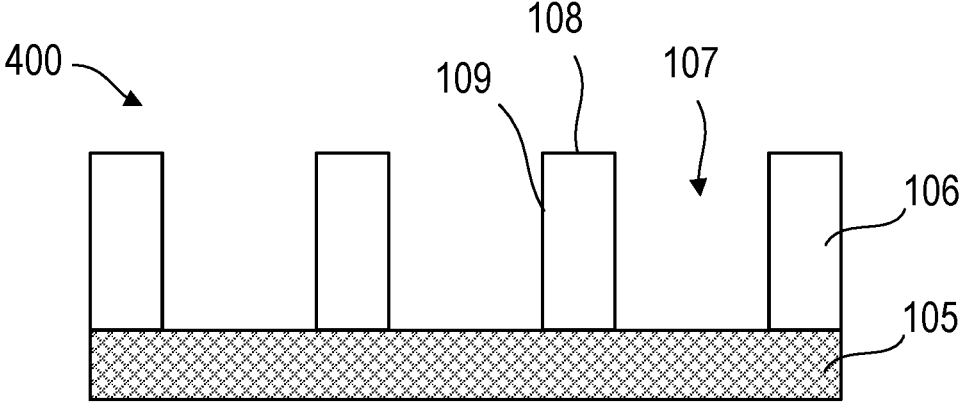
FIGS. 4A-4F schematically show through cross-sectional views a method of processing a substrate according to an embodiment of the invention.
Figure 4B:
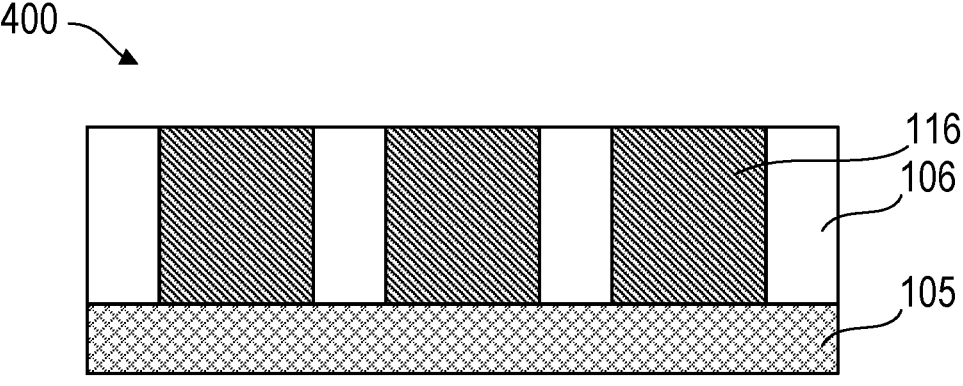
Figure 4C:
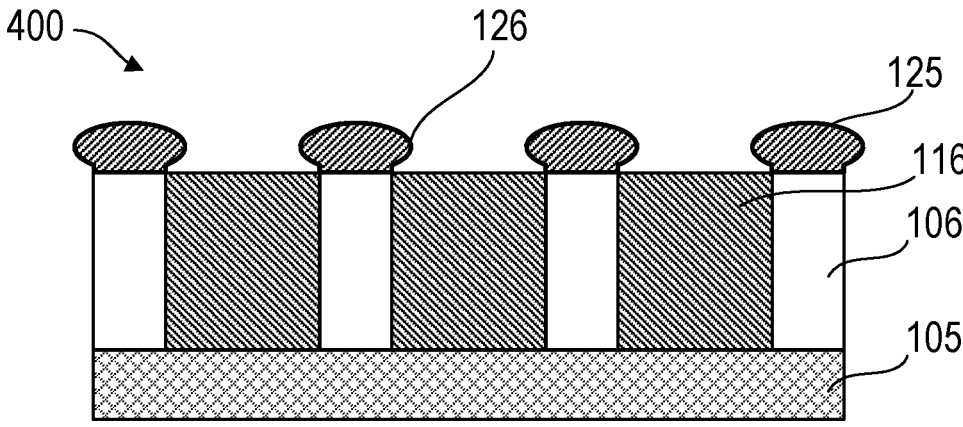

FIGS. 4A-4E schematically show through cross-sectional views a method of processing a substrate according to an embodiment of the invention. The substrate 100 in FIG. 1B has been reproduced as substrate 400 in FIG. 4A. The method further includes filling the filling the void 107 with a sacrificial fill material 116. According to one embodiment, the sacrificial fill material 116 can include amorphous carbon (a-C). The resulting structure is schematically shown in FIG. 4B. The method further includes selectively depositing a cap layer 125 on the top area 108 of the raised metal features 106, where the cap layer 125 has an overhang 126 that extends past the sidewall. The deposition of the cap layer 125 can be performed until a degree of mushrooming (i.e., lateral growth) is reached. In the embodiment shown in FIG. 4C, the overhang 126 covers a portion of the sacrificial fill material 116.

The method further includes depositing a dielectric film 130 on the sacrificial fill material 116 and the cap layer 125. The dielectric film 130 can, for example, include a silicon-containing dielectric material such as SiO$_2$, SiOC, or SiOCN. The resulting structure is schematically shown in FIG. 4D.

Figure 4D:
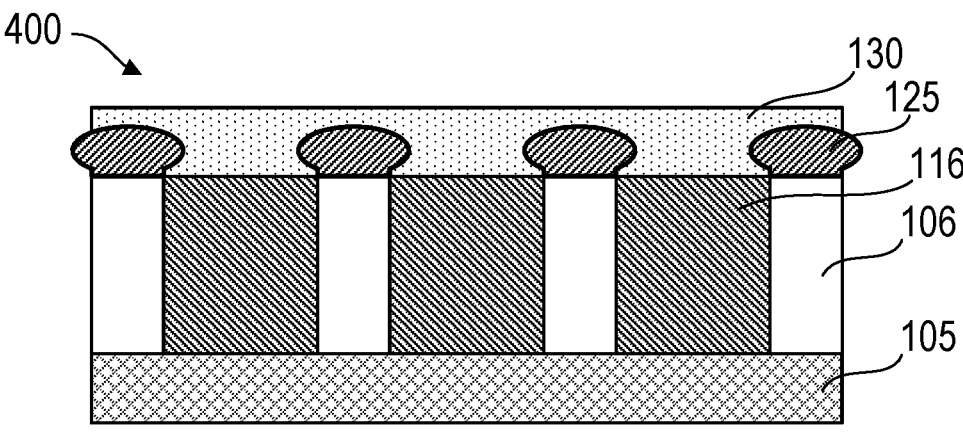
Figure 4E:
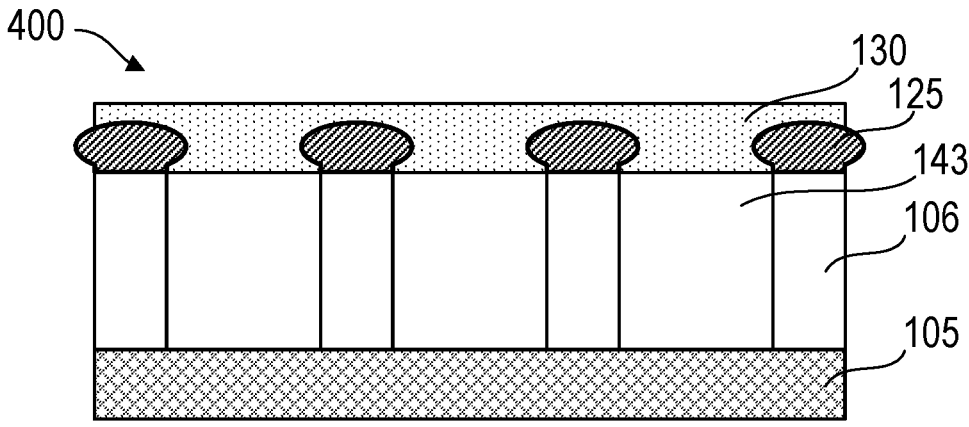

The method further includes heat-treating the film structure in FIG. 4D to remove the sacrificial fill material 116. In one example, amorphous carbon may be removed by heat-treating in an oxidizing atmosphere such as O$_2$. The resulting film structure is schematically shown in FIG. 4E where air gap 143 is formed between raised metal features 106. The heat-treating results in decomposing the sacrificial fill material 116 into one or more gaseous decomposition products, and removes at least one of the one or more gaseous decomposition products by diffusion through the dielectric film, where the decomposition of the sacrificial fill material leaves an air gap between the raised metal features below the overhang.

Figure 4F:
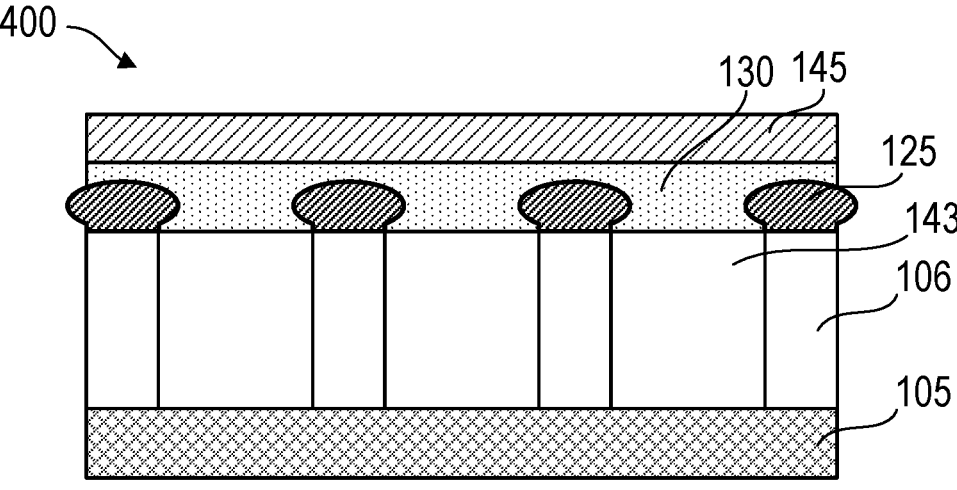

According to one embodiment, the method can further include depositing a blanket dielectric film 145 over the film structure in FIG. 4E. This is schematically shown in FIG. 4F.

Figure 5A:
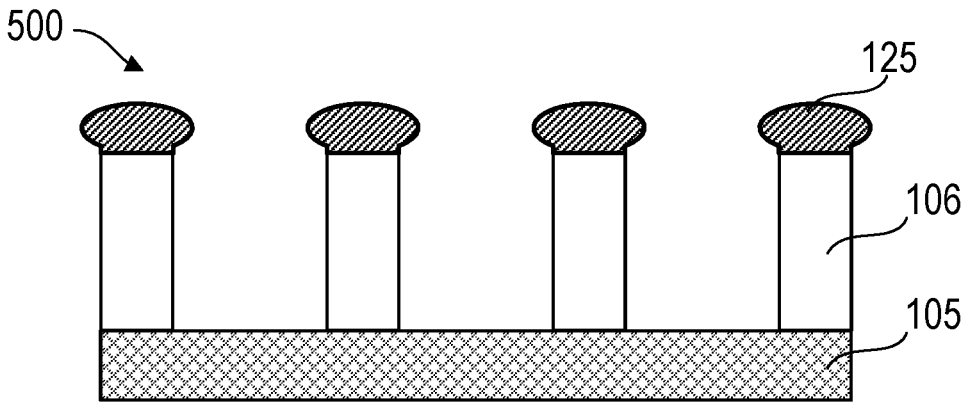
FIGS. 5A-5F schematically show through cross-sectional views a method of processing a substrate according to an embodiment of the invention.
Figure 5B:
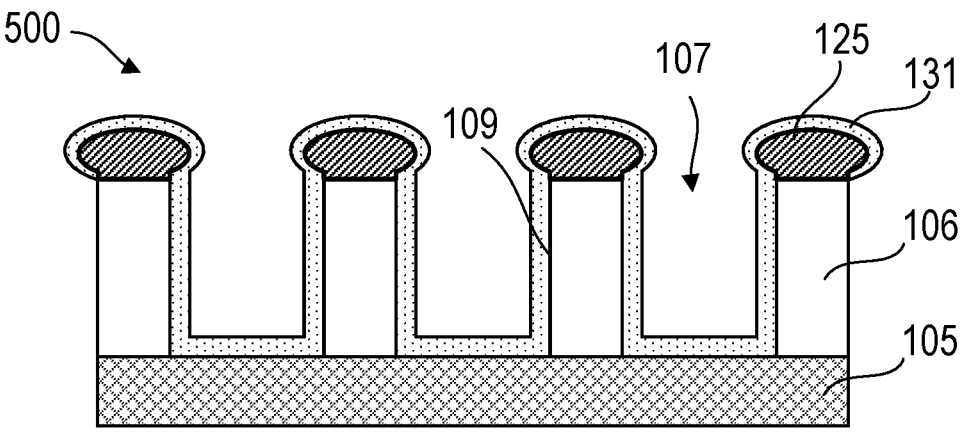

FIGS. 5A-5E schematically show through cross-sectional views a method of processing a substrate according to an embodiment of the invention. The substrate 100 in FIG. 1F has been reproduced as substrate 500 in FIG. 5A. The method further includes depositing a conformal dielectric layer 131 over the features in FIG. 5A, including on the sidewall 109 of the raised metal features 106, on the cap layer 125, and optionally on the base film 105 between the raised metal features 106. This is schematically shown in FIG. 5B. Examples of the conformal dielectric layer 131 include SiO$_2$, SiOC, and SiOCN.

Figure 5C:
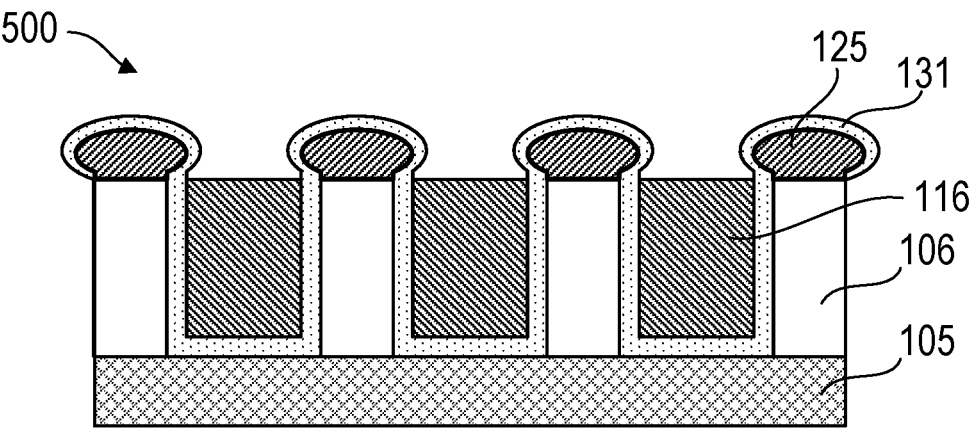

The method further includes filling the void 107 with a sacrificial fill material 116. According to one embodiment, the sacrificial fill material can include amorphous carbon (a-C). The resulting structure is schematically shown in FIG. 5C. The method further includes depositing a dielectric film 130 on the sacrificial fill material 116 and on the conformal dielectric layer 131. The dielectric film 130 can, for example, include a silicon-containing dielectric material such as SiO$_2$, SiOC, or SiOCN. The resulting structure is schematically shown in FIG. 5D.

Figure 5D:
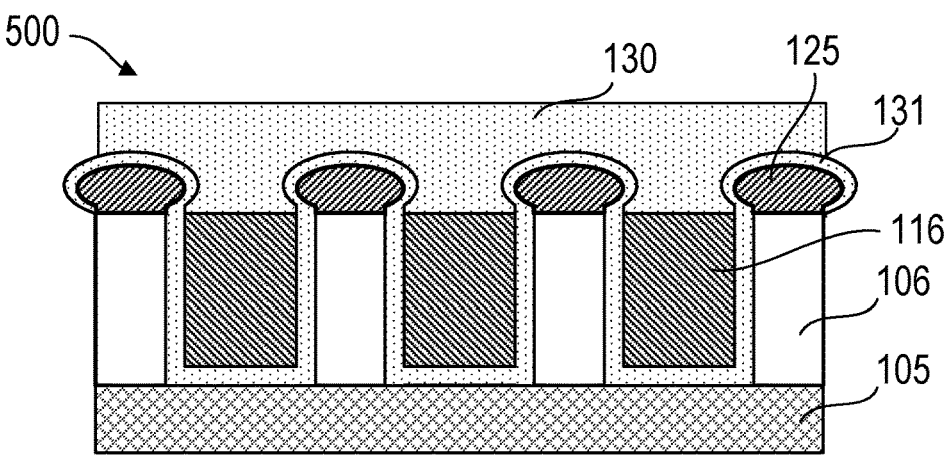
Figure 5E:
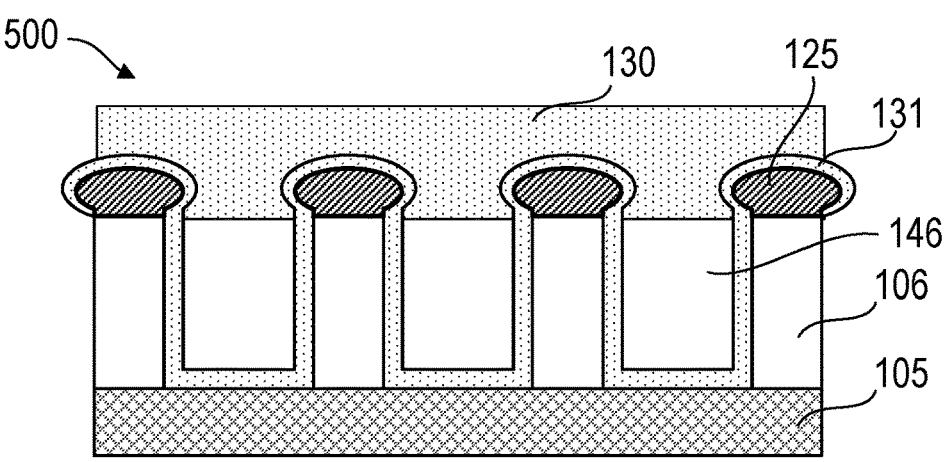
Figure 5F:
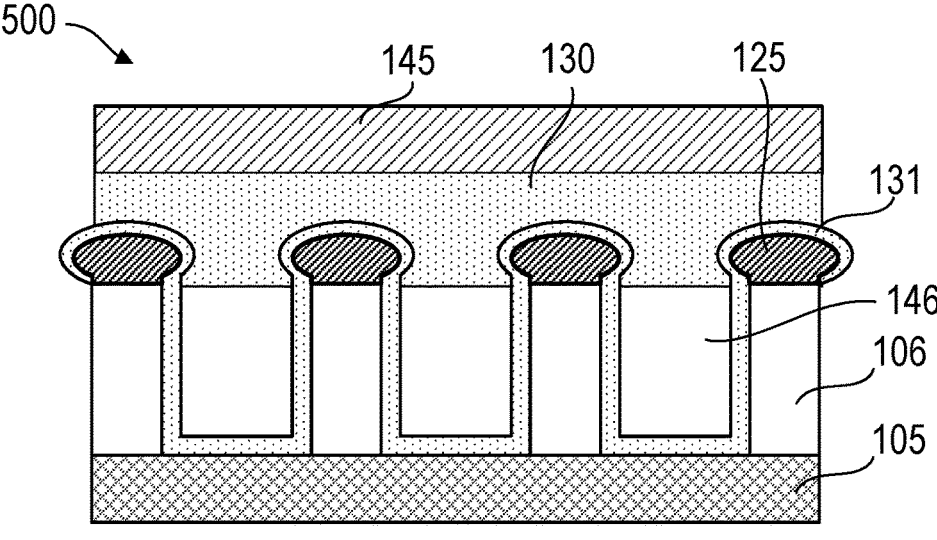

The method further includes heat-treating the film structure in FIG. 5D to remove the sacrificial fill material 116. In one example, amorphous carbon may be removed by heat-treating in an oxidizing atmosphere such as O$_2$. The resulting film structure is schematically shown in FIG. 5E where air gap 146 is formed between raised metal features 106. According to one embodiment, the method can further include depositing a blanket dielectric film 145 over the film structure in FIG. 5E. The resulting structure is schematically shown in FIG. 5F.

A plurality of embodiments for a method of forming a semiconductor device with air gaps for low capacitance interconnects have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
providing a substrate containing raised metal features with a top area and a sidewall, and a void between the raised metal features;
filling the void with a sacrificial fill material;
selectively depositing a blocking layer on the sacrificial fill material;
depositing a cap layer on the top area of the raised metal features, wherein the cap layer has an overhang that extends past the sidewall;
removing the blocking layer and the sacrificial fill material between the raised metal features; and
depositing a dielectric film, wherein the dielectric film forms an air gap between the raised metal features below the overhang.

2. The method of claim 1, wherein the cap layer and the dielectric film contain the same dielectric material.

3. The method of claim 1, wherein the cap layer and the dielectric film contain different dielectric materials.

4. The method of claim 1, wherein the removing includes an anisotropic etching process that removes a portion of the sacrificial fill material and leaves a spacer layer on the sidewall of the raised metal features.

5. The method of claim 1, wherein the depositing the dielectric film includes, in any order, conformally depositing a first portion of the dielectric film and non-conformally depositing a second portion of the dielectric film.

6. The method of claim 1, wherein the raised metal features include ruthenium metal, molybdenum metal, tungsten metal, copper metal, cobalt metal, a binary metal alloy, or a ternary metal alloys.

7. The method of claim 1, wherein the sacrificial fill material includes SiO$_2$ or SiOC.

8. The method of claim 1, wherein the cap layer includes Al$_2$O$_3$, HfO$_2$, SiCN$_x$, TiO$_2$, AlON$_x$, AlN$_x$, SiO$_2$, SiOC, SiOCN, or a carbon-based layer.

9. The method of claim 1, wherein the blocking layer includes a self-assembled monolayer (SAM), a bi-layer SAM, or a carbon-based material.

* * * * *